(12) United States Patent
Rottner et al.

(10) Patent No.: US 11,531,062 B2
(45) Date of Patent: Dec. 20, 2022

(54) POWER SUPPLY, AUTOMATED TEST EQUIPMENT, METHOD FOR OPERATING A POWER SUPPLY, METHOD FOR OPERATING AN AUTOMATED TEST EQUIPMENT AND COMPUTER PROGRAM USING A VOLTAGE VARIATION

(71) Applicant: Advantest Corporation, Tokyo (JP)

(72) Inventors: Franz Rottner, Böblingen (DE); Martin Fischer, Böblingen (DE); Alois Thalmaier, Böblingen (DE); Rudi Bauer, Böblingen (DE)

(73) Assignee: ADVANTEST CORPORATION, Tokyo (JP)

( * ) Notice: Subject to any disclaimer, the term of this patent is extended or adjusted under 35 U.S.C. 154(b) by 152 days.

(21) Appl. No.: 16/895,926

(22) Filed: Jun. 8, 2020

(65) Prior Publication Data
US 2020/0326372 A1  Oct. 15, 2020

Related U.S. Application Data

(63) Continuation of application No. PCT/EP2020/057003, filed on Mar. 13, 2020.

(60) Provisional application No. 62/817,981, filed on Mar. 13, 2019.

(51) Int. Cl.
| G01R 31/00  | (2006.01) |
| G01R 31/26  | (2020.01) |
| G01R 31/28  | (2006.01) |
| G01R 1/02   | (2006.01) |
| G01R 31/317 | (2006.01) |

(52) U.S. Cl.
CPC ... *G01R 31/31721* (2013.01); *G01R 31/2834* (2013.01)

(58) Field of Classification Search
CPC ........ G01R 31/00; G01R 31/26; G01R 31/28; G01R 31/317; G01R 1/02
See application file for complete search history.

(56) References Cited

U.S. PATENT DOCUMENTS

| 6,005,373 A    | * | 12/1999 | Snodgrass ........... G11C 29/56 323/266 |
| 2002/0186037 A1 |   | 12/2002 | Eldridge et al. |
| 2011/0181308 A1 |   | 7/2011  | Ishida et al. |
| 2012/0146416 A1 |   | 6/2012  | Ishida et al. |
| 2013/0229197 A1 | * | 9/2013  | Kusaka ........... G01R 31/31924 324/750.01 |

* cited by examiner

*Primary Examiner* — Neel D Shah

(57) ABSTRACT

A power supply is configured to perform an at least partial compensation of a voltage variation caused by a load change using a voltage variation compensation mechanism which is triggered in response to an expected load change. An Automated test equipment for testing a device under test comprises a power supply, which is configured to supply the device under test. The automated test equipment comprises a pattern generator configured to provide one or more stimulus signals for the device under test. The power supply is configured to perform an at least partial compensation of a voltage variation caused by a load change using a voltage variation compensation mechanism which is activated in synchronism with one or more of the stimulus signals and/or in response to one or more response data signals from the device under test. Corresponding methods and a computer program are also described.

20 Claims, 5 Drawing Sheets

DPS with droop compensation and active droop cancelation

POWER SUPPLY, AUTOMATED TEST EQUIPMENT, METHOD FOR OPERATING A POWER SUPPLY, METHOD FOR OPERATING AN AUTOMATED TEST EQUIPMENT AND COMPUTER PROGRAM USING A VOLTAGE VARIATION

CROSS-REFERENCE TO RELATED APPLICATIONS

This application is a continuation of co-pending International Application No. PCT/EP2020/057003, filed Mar. 13, 2020, which is incorporated herein by reference in its entirety, which claims priority to U.S. Provisional Application 62/817,981 entitled "Active Droop Cancellation," filed Mar. 13, 2019, and hereby incorporated by reference in its entirety.

TECHNICAL FIELD

An embodiment according to the invention is related to a power supply.

Another embodiment according to the invention is related to an automated test equipment.

Another embodiment according to the invention is related to a method for operating a power supply.

Another embodiment according to the invention is related to a method for operating an automated test equipment.

Another embodiment according to the invention is related to a computer program for performing said methods.

Generally speaking, embodiments according to the invention are related to an active droop cancellation.

BACKGROUND OF THE INVENTION

Power supplies, or regulated power supplies, are applied in many technical applications. For example, regulated power supplies are used in most electrical apparatuses, like computers, multimedia devices, and so on. Furthermore, regulated power supplies are also used in electrical laboratory environments in which, typically high requirements are set.

Moreover, regulated (or controlled) power supplies are typically also used in automated test equipment in order to provide one more supply voltages for device under test (or even for multiple devices under test). For example, in automated test equipment, it is often desirable to program the supply voltage in a test program and to perform tests at different supply voltages. Also, it is typically desirable to have a very well-defined and stable supply voltage in an automated test equipment, in order to be able to reliably characterize a device under test.

However, it has been found that problems arise when there are load changes. For example, an abrupt increase of a load current of a load connected to a power supply (or of a DUT which is tested using an automated test equipment) may result in a voltage drop. It has been found that such load changes often occur very fast, such that it is very difficult to keep the supply voltage, which is provided to the load, within an acceptable range. For example, there are conventional solutions showing voltage droop, if a sudden load change occurs at the output of a device-under-test (DUT) power supply.

In view of this situation, there is a desire to create a concept which provides for an improved tradeoff between implementation effort and supply voltage integrity.

SUMMARY OF THE INVENTION

An embodiment according to invention creates a power supply (e.g., for use in an automated test equipment). The power supply is configured to perform an at least partial compensation of a voltage variation (e.g., of a voltage drop, or a voltage overshoot; e.g., of a voltage variation of a supply voltage provided by the power supply) caused by a load change using a voltage variation compensation mechanism (e.g., a "feed forward" voltage variation compensation mechanism or an "active" voltage variation compensation mechanism) which is triggered in response to an expected load change (e.g., by a signaling indicating an expected load change).

This embodiment according to the invention is based on the idea that a voltage drop of a supply voltage, which is provided to a load by the power supply, which is caused by a load change (for example, by an abrupt increase of a current consumed by a load, or by an abrupt decrease of a current consumed by a load) can be efficiently reduced by triggering a voltage variation compensation mechanism already when a load change is expected, and not only when the load change has already occurred. By triggering the voltage variation compensation mechanism in response to an expected load change, and not only when a feedback signal indicates that the load change has actually occurred, a depth of a voltage drop or of a voltage overshoot can be significantly reduced (for example, when compared to conventional mechanisms in which a regulation only starts to react after the load change has actually occurred).

Since closed loop control mechanisms always comprise a certain delay (or, equivalently, a limited bandwidth), the above-mentioned voltage variation compensation mechanism, which relies on an in-advance signaling of a load change (i.e., a signaling of an expected load change) helps to improve a stability of the supply voltage and, in particular, helps to avoid excessive deviation of the supply voltage from a desired value even in the presence of load changes.

By adapting the power supply to an expected load change (i.e., before the load change actually occurs), for example, by an injection of a compensation current into an output of the power supply, or by an injection of a voltage variation compensation quantity into a control loop of the power supply, latencies can be avoided, and it can be reached that the power supply already counteracts a voltage variation (e.g., a voltage drop or a voltage overshoot) at the time at which the load change actually occurs (for example, by providing an increased or reduced supply current).

However, it has also been found that the above-mentioned "proactive" voltage variation compensation mechanism, which is not only triggered in response to the actual occurrence of a load change, but already when a load change is expected to occur in the close future, helps to achieve a good supply voltage integrity.

Moreover, it has been found that usage of a voltage variation compensation mechanism, which is triggered in response to an expected load change, can typically be implemented with less effort than, for example, a high speed closed loop control which reacts to an actual load change very fast.

Thus, the above mentioned concept provides a good compromise between implementation effort and supply voltage integrity.

In a preferred embodiment, the voltage variation compensation mechanism, which is triggered in response to an expected load change (e.g., by a signal indicating the expected load change, or in response to an external control signal) is an active (or "pro-active" or not only reactive) voltage variation mechanism which is, for example, independent from a measurement of the supply voltage and from a feedback (e.g. of the actual supply voltage) The voltage variation compensation mechanism may, for example, be triggered by a test control or a test processor of an automated test equipment in synchronism with a provision of one or more stimulus signals.

However, it has been found that usage of an active voltage variation compensation mechanism, which is not triggered by a feedback of the supply voltage but by a trigger mechanism which uses a-priori knowledge about an expected load change, is advantageous since such an active voltage variation compensation mechanism can become effective even before a load change occurs. Accordingly, a magnitude of a voltage variation can be reduced, and an excessive voltage variation in response to a load change can be avoided.

In that the trigger mechanism is not only reactive (in that it only responds to an actual variation of the supply voltage) but actually is triggered independently from the actual supply voltage allows for a proactive (at least partial) compensation of a supply voltage variation. In other words, by using a triggering of the voltage variation compensation mechanism using knowledge about an expected (future) load change, such an "active" or a "proactive" functionality of the voltage variation compensation mechanism can be reached, wherein it should be noted that many typical loads comprise a substantially deterministic current consumption, such that a trigger mechanism (which triggers the voltage variation compensation mechanism) can recognize a future (expected) load change in advance, for example on the basis of stimulus signals provided to the load or on the basis of digital response signals provided by the load.

To conclude, the above described active voltage variation compensation mechanism has been found to bring a good supply voltage integrity with moderate effort.

In a preferred embodiment, the voltage variation compensation mechanism, which is triggered in response to an expected load change (e.g., by the signaling indicating the expected load change, or by a test control or a test processor of an automated test equipment in synchronism with a provision of one or more stimulus signals) is a feed forward voltage variation compensation mechanism (e.g., independent from a measurement of the supply voltage and from a feedback). By having a feed forward voltage variation compensation mechanism, which anticipates a load change and takes measures to at least partially compensate the variation of the supply voltage provided to the load even before an actual load change occurs, an excessive variation of the supply voltage can be avoided. The "feed forward" characteristics of the voltage variation compensation mechanism implies that a signal is provided for the at least partial compensation of the voltage variation in response to an external information that indicates an expected load change independent from a measurement of the supply voltage and independent from a feedback. Further, this signaling, which is based on an a-priori knowledge when a load change is to be expected allows for a fast reaction to the expected load change and therefore helps to avoid an excessive variation of the supply voltage.

In a preferred embodiment, the voltage variation compensation mechanism is adapted to become active before the load change takes place. Consequently, a magnitude of a supply voltage variation can be limited, even in view of an inertia of the voltage variation compensation mechanism. For example, the voltage variation compensation mechanism can be triggered early enough that an increased supply current is provided to the load at the time of the load change even in view of delays of power semiconductor devices providing the supply current and/or even in view of delays in a signal processing chain, e.g., in an analog or digital regulation circuit. Thus, a triggering of an adaptation of the power supply to a load change even before the load change occurs results in a significant reduction of a magnitude of the variation of the supply voltage.

In a preferred embodiment, the power supply comprises a voltage regulation loop (e.g., an analog or digital regulation loop) which is configured to regulate an output voltage of the power supply. The voltage variation compensation mechanism is configured to inject a voltage variation compensation quantity into the voltage regulation loop in response to an expected load change or in response to a signaling of an expected load change (e.g., before the load change actually occurs; e.g., to thereby anticipate or preempt the load change) or in response to a signal from a test control (e.g., a test processor) of an automated test equipment. The injection of the voltage variation compensation quantity into the voltage regulation loop may, for example, have the effect to increase a current which is provided to the load/e.g. in case that a load current increase is expected). Since the voltage regulation loop typically comprises latencies, the injection of the voltage variation compensation quantity in response to an expected load change or in response to a signal from a test control of an automated test equipment provides the possibility that the response to the voltage variation compensation quantity, e.g., an increase of the supply current, occurs at the same time as the load change or shortly after the actual load change, or even shortly before the actual load change. In particular, by injecting the voltage variation compensation quantity into the voltage regulation loop, it can be achieved that the response to this injection occurs temporally closer to a load change than a response of the voltage regulation loop that would be generated in view of the actual variation of the supply voltage. By using a-priori knowledge about the expected load change, the voltage variation compensation quantity can be injected into the regulation loop even before the actual load change occurs, and the voltage variation compensation quantity can also be injected into the voltage regulation loop in such a manner that the voltage variation compensation quantity does not need to pass through the full voltage regulation loop but rather bypasses one or more functional blocks of the voltage regulation loop. Accordingly, a good adaptation of the response to the voltage variation compensation quantity to the load change (e.g. better than a response of the voltage regulation loop to an actual supply voltage variation) can be achieved.

To conclude, by using the above mentioned injection of the voltage variation quantization quantity, a fast and even possibly preemptive (at least partial) compensation of a supply voltage variation can be achieved.

In a preferred embodiment, the voltage variation compensation quantity is adapted to counteract an expected voltage variation caused by the expected load change (to thereby at least partially compensate the voltage variation). Accordingly, an actual voltage variation caused by the load change can be reduced when compared to a voltage variation that would occur in the absence of the voltage variation compensation mechanism.

In a preferred embodiment, the power supply comprises a voltage regulation loop which is configured to regulate an output voltage of the power supply. The voltage variation compensation mechanism is configured to cause a step-change of a control signal of the voltage regulation loop in response to a signaling indicating the expected load change or in response to a signal from a test control of an automated test equipment. It has been found that a step-change of a control signal of the voltage regulation loop (for example, a step change of a drive signal for one or more power semiconductor devices providing the supply current) helps to at least partially compensate an abrupt load change. For example, an abrupt load change may comprise an abrupt increase or decrease of the load current, and said change of the control signal of the voltage regulation loop may, for example, cause a similar abrupt change of the supply current which is provided by one or more power semiconductor devices of the power supply. The abrupt change of the control signal of the voltage regulation loop may, for example, be larger than a short time response of the voltage regulation loop to a change of the supply voltage (which may be caused by a load change). Thus, the described mechanism allows to avoid an excessive degradation of the supply voltage.

In a preferred embodiment, the power supply comprises a voltage regulation loop which is configured to regulate an output voltage of the power supply. The control loop comprises a regulator (e.g., an analog or digital regulator) configured to determine a control signal, in order to regulate a supply voltage provided by the power supply to a desired value. The regulator comprise an (analog or digital) integrator (which may, for example, receive a signal or an information describing a difference between a desired value of the supply voltage and an actual value of the supply voltage as an input quantity, and an output signal of which may, for example, be used to derive a control signal for an output stage which provides a supply current in order to obtain the desired supply voltage). Moreover, the voltage variation compensation mechanism is configured to modify (e.g., increase by a predetermined value, or decrease by a predetermined value) a value of the integrator in response to a signaling of the expected load change (e.g., in a step-wise manner and/or in a feed-forward manner; e.g., independent from a feedback signal) or in response to a signal from a test control (e.g., a test processor) of an automated test equipment.

It has been found that a modification (or step-wise modification) of a value of an integrator in an analog or digital regulator can be implemented easily, and can provide a fast reaction of the power supply to an expected load change. For example, the analog or digital integrator may be part of a proportional-integral controller or proportional-integral-differential controller, and may help to accurately regulate a steady state supply voltage. Thus, the analog or digital integrator may be helpful to obtain a precise regulation and a good stability of the control. On the other hand, the analog or digital integrator also imposes an inertia onto the analog or digital regulator. This inertia can be overcome by step wisely changing the value of the analog or digital integrator (for example, by a modification of a digital integrator value or by a modification of an analog integrator value using a current injection). Furthermore, the circuit effort or algorithmic effort for such a change of the integrator value is comparatively small, while the change of the integrator value still provides a good responsiveness. In particular, the overall control loop does not need to be changed except for the introduction of a possibility to change the integrator value. Furthermore, such a structure allows that the modification of the integrator value at least partially compensates a load step before the control loop becomes effective and that the control loop can take over the further regulation after the load step. Thus, the modification of the integrator value in response to the signaling of the expected load change or in response to a signal from the test control can accelerate the handling of a load step (even in a pre-emptive manner) without significantly modifying the control loop.

In a preferred embodiment, the regulator is a digital regulator and the voltage variation compensation mechanism is configured to increase or decrease a value of the (digital) integrator in response to the signaling of the expected load change or in response to a signal from a test control (e.g., a test processor) of an automated test equipment. By effecting an increase or decrease of a value of the digital integrator of the digital regulator, the speed-disadvantages of the digital regulator (for example, when compared to an analog regulator) can be overcome, while the advantages of a digital regulator (in particular, the flexibility of the configuration) are maintained.

In a preferred embodiment, the voltage variation compensation mechanism is configured to inject a voltage variation compensation quantity (e.g. a current) at an output of the power supply in response to the signaling indicating the expected load change or in response to a signal from a test control (e.g., a test processor) of an automated test equipment. In such a manner, a variation of the supply voltage may, for example, at least partially be compensated. It should be noted that the injection of a voltage variation compensation quantity (e.g., of a current that at least partially compensates a change of a load current) at the output of the power supply is particularly fast, since delays, which typically occur in a regulation loop, are avoided. For example, a dedicated switchable and/or adjustable current source may be used to inject a current at the output of the power supply as the voltage variation compensation quantity, wherein a timing at which the dedicated current source is activated and/or deactivated may be determined by the signal indicating the expected load change or by the signal from the test control of the automated test equipment. Furthermore, a magnitude of the current provided by the dedicated current source may be adapted to an expected load change (or load current variation).

Consequently, a variation of the supply voltage may be limited to an acceptable value.

In a preferred embodiment, the voltage variation compensation mechanism is configured to inject a current, which at least partially compensates the expected load change, at the output of the power supply in response to the signaling indicating the expected load change or in response to a signal from a test control (e.g., from a test processor) of an automated test equipment. Accordingly, as discussed before, a supply voltage variation may be limited to an acceptable value.

In a preferred embodiment, the voltage variation compensation mechanism is configured to at least partially compensate both a voltage drop (which may, for example, be caused by an abrupt load increase, e.g., by a full or partial activation of a device under test supplied by the power supply) and a voltage over shoot (which may, for example, be caused by an abrupt load reduction, e.g., by a full or partial deactivation of a device under test supplied by the power supply). In other words, the voltage variation compensation mechanism may not only be limited to an increase of a load current but may also help to compensate a voltage overshoot caused by a load current reduction. Thus, the power supply may both avoid a load malfunction which could be caused by an excessive voltage drop and a load damage which could be caused by an excessive voltage overshoot. In particular, it should be noted that the same voltage variation compensation mechanism may be applied to avoid both an excessive voltage drop and an excessive voltage overshoot.

In a preferred embodiment, the voltage variation compensation mechanism is configured to adapt (or to be adapted) to an expected magnitude of the expected load change (wherein, for example, a magnitude of the voltage variation compensation quantity is adjustable). Thus, the voltage variation compensation mechanism may be adapted to different situations comprising different magnitudes of the expected load change. For example, an a-priory knowledge about the magnitude of the expected load change may be used to adjust a magnitude of a supply current variation that is effected by the voltage variation compensation mechanism.

In a preferred embodiment, the voltage variation compensation mechanism is configured to obtain the signaling indicating an expected load change in synchronism with a provision of one or more (e.g., digital) stimulus signals (e.g., test signals which are preferably digital signals or data signals) to a load which is supplied by the power supply (and which is expected to exhibit a load change in response to the one or more stimulus signals). Accordingly, an a-priory knowledge, when certain stimulus signals cause a load change (and how large a magnitude of said load change is expected to be) may be exploited. For example, in a situation in which a certain (preferably digital) stimulus signal causes a load change (for example, by an activation of a load, or by an activation of a component of the load), a load change can be predicted (for example, in that the time and/or the magnitude of the load change can be predicted). Accordingly, it is possible to obtain the signaling indicating an expected load change, for example, in such a manner that the signaling precedes the actual load change. Consequently, an excessive variation of the supply voltage can be prevented.

Similarly, a reduction of the load current may also be caused by (or may be correlated with) a certain stimulus signal, such that the time at which the load reduction occurs can be predicted.

An embodiment according to the invention creates an automated test equipment for testing a device under test. The automated test equipment comprises a power supply (for example, a device power supply) which is configured to supply the device under test. The automated test equipment also comprises a pattern generator configured to provide one or more stimulus signals (e.g., digital stimulus signals) for the device under test. The power supply is configured to perform an at least partial compensation of a voltage variation (e.g., of a voltage drop, or for a voltage overshoot) (e.g., of a voltage variation of a supply voltage provided by the power supply) caused by a load change using a voltage variation compensation mechanism (which may, for example, be a feed forward voltage variation compensation mechanism and/or an active voltage variation compensation mechanism) which is activated (or triggered) in synchronism with a provision of one or more of the stimulus signals (e.g., digital stimulus signals) and/or in response to one or more response data signals (e.g., digital response signals) from the device under test.

It has been found that such an automated test equipment allows for a reduction of supply voltage variations to an acceptable degree. For example, it has been found that, in the testing of a device under test, load changes (for example, increases or reductions of a supply current of the device under test) are typically temporally correlated with test patterns (or, generally, stimulus signals) applied to the device under test. Thus, it has been found that the knowledge of the behavior of the device under test can be used to activate the voltage variation compensation mechanism "at the right time" by synchronizing the time at which the voltage variation compensation mechanism is activated with the provision of the one or more stimulus signals. For example, the automated test equipment may therefore set the time at which the voltage variation compensation mechanism is activated to be synchronized with the one or more stimulus signals. Consequently, it is possible to even activate the voltage variation compensation mechanism before an actual load change occurs. For example, the activation of the voltage variation compensation mechanism may comprise a pro-active or "feed-forward" increase or reduction of the supply current for the device under test, wherein a timing of said "pro-active" or a "feed-forward" increase or reduction of the supply current may be synchronized with the provision of the one or more stimulus signals. For example, the timing for the activation of the voltage variation compensation mechanism and for the provision of the stimulus signal may be based on a common timing reference, which allows for a proper activation of the voltage variation compensation mechanism.

However, as an alternative, the voltage variation compensation mechanism may also be activated in response to one or more response data signals from the device under test. For example, there may be an a-priory knowledge that a certain evolution (or signal pattern) of the response data signals (or certain data values represented by the response data signals) may be followed by a load change and this knowledge may be used to determine the timing of the voltage variation compensation mechanism on the basis of the one or more response data signals. For example, there may be a certain response data signal (or signal pattern) which indicates that the device under test will, within a certain amount of time, increase its current consumption or reduce its current consumption. Thus, if such response data signals (or signal patterns) are detected, the voltage variation compensation mechanism may be activated and may even anticipate (or preempt) the actual load change.

Using such a mechanism, it can be avoided that test results of the dut test are degraded by excessive variations of the supply voltage.

In a preferred embodiment, the automated test equipment is configured to provide the one or more stimulus signals in synchronism with a common clock signal and/or in synchronism with a common synchronization signal. In addition, the power supply is also configured to trigger a compensation operation (e.g., an operation of the voltage variation compensation mechanism) for performing the at least partial compensation of the voltage variation in synchronism with the common clock signal and/or in synchronism with the common synchronization signal (for example, at a predetermined time with respect to the common clock signal and/or with respect to the common synchronization signal; for example, independent from a feedback of an actual supply voltage of the device under test).

By using a fixed timing relationship between a provision of the one or more stimulus signals and a triggering of the compensation operation, a deterministic behavior of the device under test (with respect to a load change) can be exploited, and it is possible to trigger the compensation operation even before the actual load change occurs. A slow feedback mechanism, for example with respect to a feedback of an actual supply voltage of the device under test, can be bypassed in this manner (wherein the feedback of the actual supply voltage may still be used for a fine adjustment of a steady state supply voltage).

In a preferred embodiment, the power supply is configured to trigger a compensation operation (or an operation of the voltage variation compensation mechanism for performing the at least partial compensation of the voltage variation) in synchronism with a stimulus signal which activates a device under test or which activates a device under test component or which triggers an operation of the device under test or which deactivates a device under test or which deactivates a device under test component (for example, in anticipation of a load step). In other words, by triggering the compensation operation in temporal synchronism with a stimulus signal which causes a load-changing activity or behavior of the device under test, the knowledge about the behavior of the device under test can be exploited. Furthermore, it can be achieved that the compensation operation becomes active even before the actual load step occurs, which reduces a supply voltage degradation.

In a preferred embodiment, the power supply is a power supply as described above. In other words, it has been found that the above mentioned power supply can be advantageously used in the automated test equipment described herein.

An embodiment according to the invention creates a method for operating a power supply (for example, for use in an automated test equipment). The method comprises performing an at least partial compensation of a voltage variation (e.g., of a voltage drop, or of a voltage overshoot) (e.g., a voltage variation of a supply voltage provided by the power supply) caused by a load change using a voltage variation compensation mechanism (for example, a feed-forward voltage variation compensation mechanism and/or an active voltage variation compensation mechanism) which is triggered in response to an expected load change, e.g., by a signaling indicating an expected load change. This method is based on the same considerations as the above mentioned power supply. Also, the method may optionally be supplemented by any of the features, functionalities and details described with respect to the power supply, both individually and taken in combination.

Another embodiment according to the invention creates a method for operating an automated test equipment for testing a device under test. The method comprises supplying power to the device under test, and the method also comprises providing one or more stimulus signals (e.g., digital stimulus signals) for the device under test. The method comprises performing an at least partial compensation of a voltage variation (e.g., of a voltage drop, or of a voltage overshoot) (e.g., of a voltage variation of a supply voltage provided by the power supply to the device under test) caused by a load change using a voltage variation compensation mechanism (e.g., a feed-forward voltage variation compensation mechanism or an active voltage variation compensation mechanism) which is activated (or triggered) in synchronism with one or more of the stimulus signals (e.g., digital stimulus signals) and/or in response to one or more response data signals (e.g., digital response signals) from the device under test. This method is based on the same considerations as the above described automated test equipment. The method may optionally be supplemented by any of the features, functionalities and details described above with respect to the automated test equipment.

Another embodiment according to the invention creates a computer program for performing one of the methods mentioned before when the computer program runs on a computer.

BRIEF DESCRIPTION OF THE FIGURES

Embodiments according to the present invention will subsequently be described taking reference to the enclosed figures in which.

DETAILED DESCRIPTION OF THE EMBODIMENTS

1. Power Supply According to FIG. 1

Figure 1:
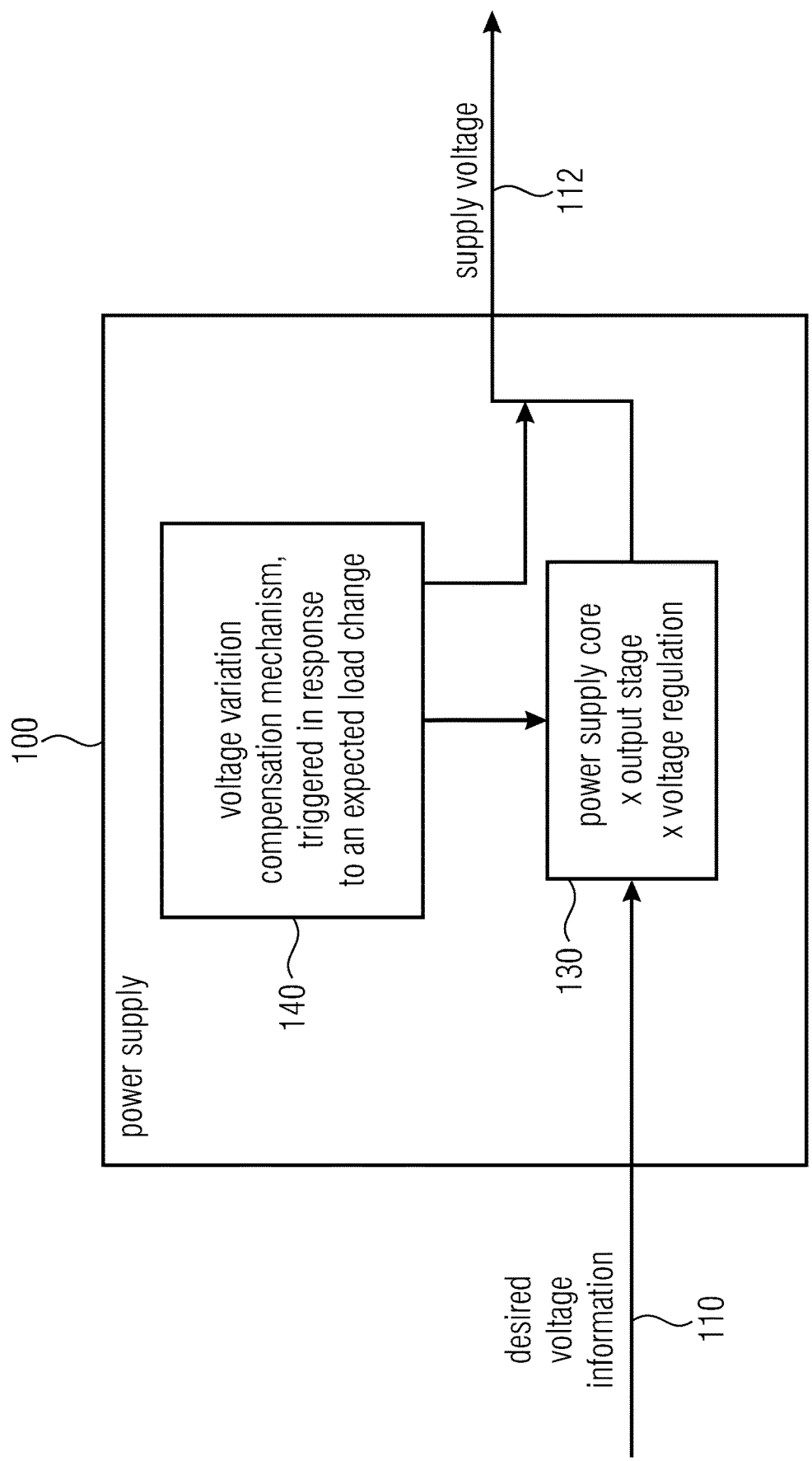
FIG. 1 shows a block schematic diagram of a power supply, according to an embodiment of the present invention.

FIG. 1 shows a block schematic diagram of a power supply, according to an embodiment of the present invention.

The power supply 100 is configured to receive a desired voltage information 110, which may be considered as being optional. Moreover, the power supply 100 is configured to provide a supply voltage 112 for a load (which may, for example, be a device under test). Generally speaking, the power supply 100 is configured to perform an at least partial compensation of a voltage variation of the supply voltage 112 caused by a load change using a voltage variation compensation mechanism which is triggered in response to an expected voltage change.

For example, the power supply may comprise a power supply core 130 which is configured to provide the supply voltage 112. The power supply core 130 may, for example, comprise an output stage and may also, for example, comprise a voltage regulation (for example, using a closed regulation loop). Moreover, the power supply 100 comprises a voltage variation compensation mechanism 140, which is triggered in response to an expected load change. The voltage variation compensation mechanism 140 may, for example, have an impact on the power supply core and/or onto the supply current which is provided to obtain the supply voltage 112.

It should be noted that the power supply 100 typically uses a mechanism to anticipate or predict a load change and to trigger a voltage variation compensation mechanism in response to an expected load change (for example, before the load change actually occurs).

The voltage variation compensation mechanism may, for example, cause the power supply core 130 to increase a supply current in response to the expected load change (e.g., when the power supply assumes that a load change is about to happen, for example, on the basis of a load change prediction mechanism). For example, the voltage variation compensation mechanism may inject a signal into a voltage regulation (or a voltage regulation loop) of the power supply core 130 when it is expected that a load change is about to occur. Accordingly, by triggering the voltage variation compensation mechanism in response to an expected load change (wherein the voltage variation compensation mechanism may be triggered even before a load change actually occurs), an excessive variation of the supply voltage may be avoided. For example, the voltage variation compensation mechanism may become active even before a load change actually occurs or at the same time at which the load change actually occurs, or only shortly after the load change has actually occurred, while conventional closed loop regulation, which typically relies on a feedback of a supply voltage information, is typically much slower (and naturally cannot react before a load step actually occurs). By activating the voltage variation compensation mechanism even before the load change occurs, or only shortly after the load change has actually occurred, a variation of the supply voltage can be limited to a very small degree. For example, by triggering the voltage variation compensation mechanism even before the load change actually occurs, a supply current for the load can be increased even before the load change actually occurs, or in very close temporal proximity to the actual load step, such that a voltage drop due to the increased load current can be avoided, or can at least be kept reasonably small. In some cases, the "pre-trigger" functionality of the voltage variation compensation mechanism may even result in a temporary increase of the supply voltage before a load change (e.g., before an increase of a load current) such that an excessive drop of the supply voltage below a desired value can be avoided completely. A similar functionality may also occur in the presence of a reduction of a load current. In this situation, an excessive overshoot of the supply voltage, which could be caused by an abrupt reduction of the load current, can be avoided by triggering the voltage variation compensation mechanism even in advance of the load current reduction or at least in very close temporal proximity to the load current reduction. Thus, the supply current can be reduced even before the reduction of the load current, or in very close temporal proximity to the reduction of the load current, which has the effect that a supply voltage variation can be kept very small.

For example, a voltage overshoot caused by an increase of the supply current which occurs temporally shortly before a load change can be kept small by one or more capacitances circuited in parallel to the load. Furthermore, if an increase of the supply current occurs temporally shortly after a load change, a supply voltage variation may also be limited by the presence of one or more capacitances circuited in parallel with the load. Accordingly, a good supply voltage characteristic can be obtained.

Moreover, it should be noted that the voltage variation compensation mechanism may, for example, be considered as an active voltage variation compensation mechanism, since it does not "react" to a supply voltage variation but uses a prior knowledge of an expected supply voltage variation (or, equivalently, prior knowledge of an expected load change) to counteract the supply voltage variation (or at least partially compensate a supply voltage variation) independently from a monitoring of the supply voltage variation.

Moreover, it should be noted that the voltage variation compensation mechanism 140 may, for example, also be considered as a "feed forward voltage variation compensation mechanism" since it uses a prior knowledge (or an "external" knowledge) about an expected supply voltage variation (or about an expected load change) and since it injects a control quality into a closed supply voltage control loop, for example, at a point of low propagation delay (i.e., at a point at which injection of the control quality affects the supply current reasonably fast).

Accordingly, the voltage variation compensation mechanism may, for example, be adapted to become active before the load change takes place.

Moreover, it should be noted that the voltage variation compensation mechanism may, for example, inject a voltage variation compensation quantity into the voltage regulation loop (e.g., of the power supply core 130) in response to an expected load change. For example, the voltage variation compensation quantity may therefore counter act an expected voltage variation caused by the expected load change.

For example, the voltage variation compensation mechanism may be configured to cause a step change of a control signal of the voltage regulation loop (e.g., in the power supply core 130) in response to a signaling indicating the expected load change or in response to a signal from a test control.

However, it should be noted that the power supply 100 may optionally be supplemented by any of the features, functionalities and the details described herein, both individually and taken in combination.

2. Automated Test Equipment According to FIG. 2

Figure 2:
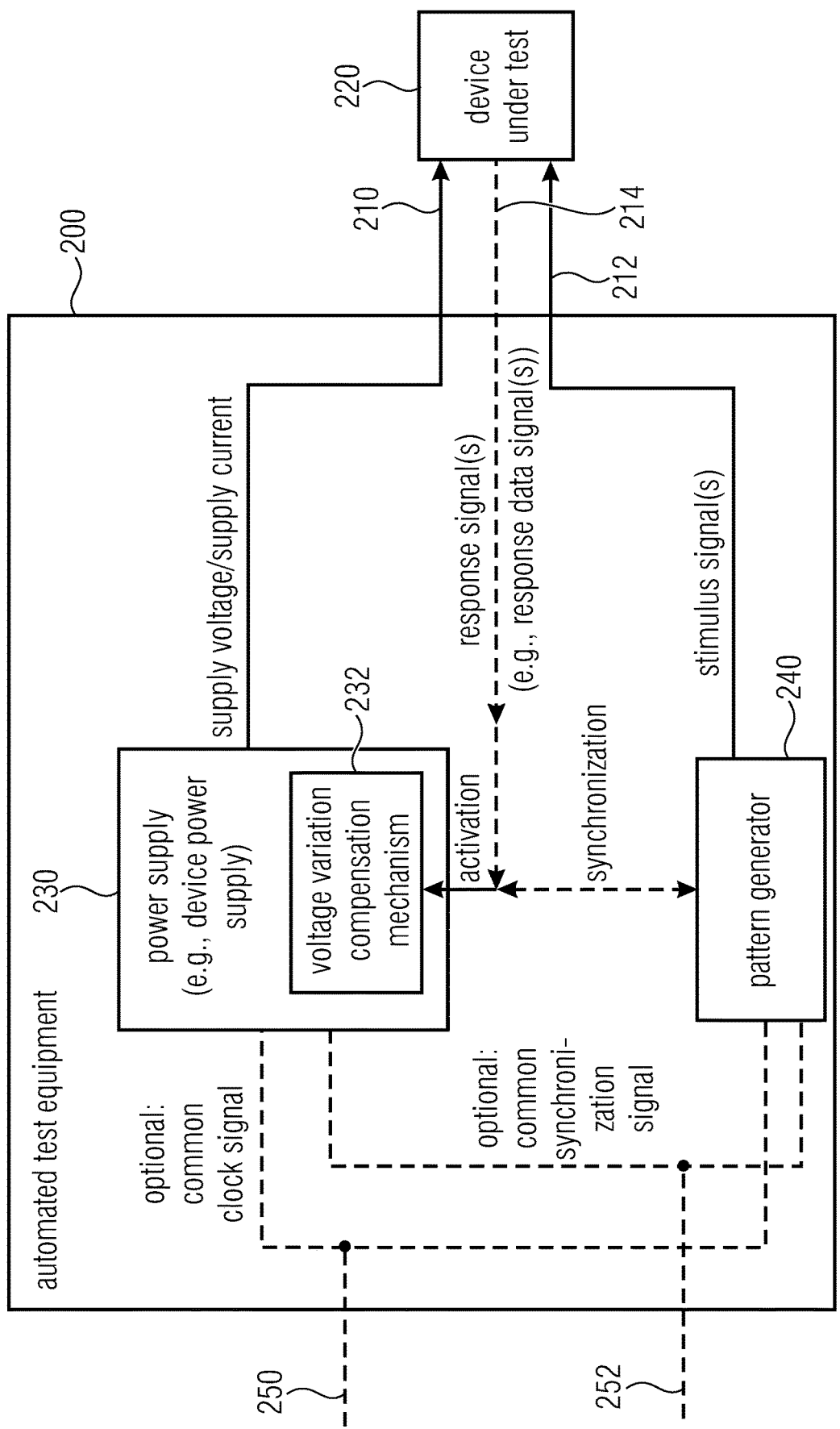
FIG. 2 shows a block schematic diagram of an automated test equipment, according to an embodiment of the present invention.

FIG. 2 shows a block schematic diagram of an automated test equipment 200, according to an embodiment of the invention.

The automated test equipment 200 is configured to provide a supply voltage 210 to a device under test 220 and to also provide one or more stimulus signals 212 to the device under test 220. Moreover, preferably, the automated test equipment may also receive one or more response signals 214 (e.g. response data signals) from the device under test 220.

The automated test equipment 200 comprises a power supply 230 (for example, a "device power supply" DPS), which is configured to supply the device under test 220, i.e., to provide the supply voltage 210 (or, equivalently, a supply current) to the device under test 220. Moreover, the automated test equipment 200 comprises a pattern generator 240 which is configured to provide the one or more stimulus signals 212 (e.g., digital stimulus signals) for the device under test 220.

In particular, the power supply 230 is configured to perform an at least partial compensation of a voltage variation (e.g., of a voltage drop, or of a voltage overshoot) caused by a load change (i.e., by a change of the current consumption of the device under test 220) using a voltage variation compensation mechanism which is activated (or triggered) in synchronism with one or more of the stimulus signals 212 (e.g. in synchronism with a provision of the one or more stimulus signals 212, or in synchronism with the pattern generator providing the one or more stimulus signals 212) and/or in response to one or more response data signals 214 from the device under test.

For example, the power supply 230 may correspond to the above-described power supply 100, wherein the supply voltage 112 may correspond to the supply voltage 210. The voltage variation compensation mechanism 232 of the power supply 230 may, for example, correspond to the voltage variation compensation mechanism 140 of the power supply 100.

However, the voltage variation compensation mechanism 232 may be activated (or triggered) in synchronism with a provision of the one or more stimulus signals 212. For this purpose, there may be a synchronization mechanism whish synchronizes the activation of the voltage variation compensation mechanism 232 and the pattern generator 240. As a consequence of this synchronization mechanism, which may be part of the automated test equipment 200, the voltage variation compensation mechanism 232 of the power supply 230 may be activated when a certain pattern of the one or more stimulus signals 212 is output to the device under test 220. For example, the activation of the voltage variation compensation mechanism 232 may be time coordinated, by the automated test equipment or by a time coordination mechanism of the automated test equipment, with the provision of a pattern of the one or more stimulus signals 212.

As an example, the pattern generator 240 may provide an activation signal or trigger signal to the voltage variation compensation mechanism 232, to thereby activate or trigger an increase or decrease of a supply current provided to the device under test 220. As another alternative, the power supply (or, more precisely, a mechanism for the activation of the voltage variation compensation mechanism 232 of the power supply 230) and the pattern generator 240 may receive a common clock signal 250 and/or a common synchronization signal 252, such that a mechanism for the activation (or triggering) of the voltage variation compensation mechanism 232 and the pattern generation by the pattern generator 240 operate in a time-synchronized manner. For example, the power supply 230 may comprise, or may be coupled to, a test control (or a test processor) which activates (or triggers) the voltage variation compensation mechanism in temporal synchronism with the common clock signal and/or the common synchronization signal, for example, in a predetermined timing relationship with the common synchronization signal (which may, at the same time, trigger or time-synchronize the provision of the one or more stimulus signals 212). Worded differently, the time at which the voltage variation compensation mechanism 232 is activated or triggered may be (solely) decided based on a timing system of the automated test equipment, but may be independent from a feedback of the supply voltage. Consequently, the activation (or triggering) of the voltage variation compensation mechanism may be time-coordinated with the expected (predicted) time at which a load change is expected or predicted, but may be independent from the actual time at which the load change occurs.

Alternatively, however, the voltage variation compensation mechanism may be triggered or activated in response to the one or more response signals 214 provided by the device under test, which may be response data signals and which may, for example, be digital signals. For example, when it is found (e.g. by an analysis of the one or more response signals) that the device under test 220 provides a certain response signal (for example, in the sense of a certain signal pattern, or in the sense of certain response data), the automated test equipment (for example, a test control or a test processor thereof) may recognize that a load change is expected, and may consequently trigger the voltage variation compensation mechanism. In other words, the test control or the test processor may analyze one or more (preferably digital) response signals of the device under test (which are typically different from power supply signals) and may trigger the voltage variation compensation mechanism in response to the evaluation of the one or more response data signals 214.

However, it should be noted that different mechanisms for the triggering of the voltage variation compensation mechanism are also possible.

As some examples, the automated test equipment may be configured to provide the one or more stimulus signals 212 in synchronism with a common clock signal 250 and/or in synchronism with a common synchronization signal 252. Accordingly, the power supply 230 may be configured to trigger a compensation operation for performing the at least partial compensation of the voltage variation in a synchronism with the common clock signal 250 and/or in synchronism with the common synchronization signal 252 (e.g., at a predetermined time, e.g., independent from a feedback of an actual supply voltage of the device under test 220).

As another example, the power supply 230 may be configured to trigger a compensation operation (or an operation of the voltage variation compensation mechanism) for performing the at least partial compensation of the voltage variation in synchronism with a stimulus signal which activates a device under test or which activates a device under test component or which triggers an operation of the device under test or which deactivates the device under test or which deactivates the device under test component (e.g., in anticipation of a load step). In other words, the automated test equipment 200 may use a-priory knowledge which stimulus signal is expected to cause a load step, wherein a load step is typically caused by an activation of a device under test e.g., from a "sleep" mode or "idle" mode or by an activation of a DUT component (for example, of a computation block or of an input/output block, or the like) or by a triggering of an operation (like, for example, a certain computation or a certain input/output operation) or by a deactivation of the device under test or by a deactivation of a device under test component. Thus, a-priory knowledge about a causal reaction of a device under test to a stimulus, which significantly changes a supply current of the device under test, is exploited. Accordingly, an expected load variation can be predicted on the basis of the stimulus signal as provided to the device under test and/or on the basis of the response signals from the device under test.

However, it should be noted that the automated test equipment 200, and also the power supply 230 thereof, may optionally be supplemented by any of the features, functionalities and the details disclosed herein, both individually and taken in combination.

3. Power Supply According to FIG. 3

Figure 3:
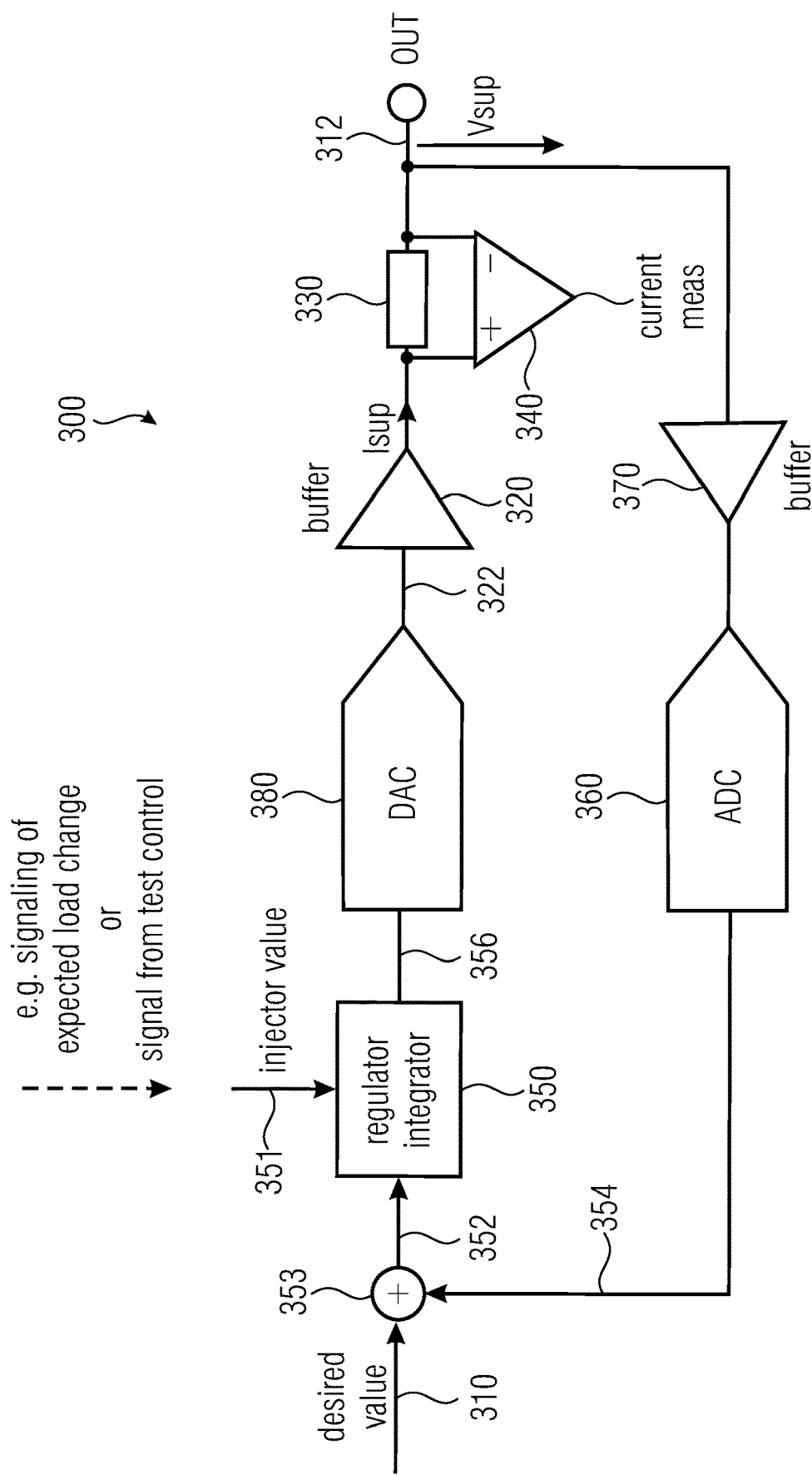
FIG. 3 shows a block schematic diagram of a power supply, according to an embodiment of the present invention.

FIG. 3 shows a block schematic diagram of a power supply, according to an embodiment of the present invention. The power supply 300 is configured to receive a desired value information 310 and to provide, on the basis thereof, an output voltage 312 (which may, for example, be applied to a load or to a device under test).

Moreover, it should be noted that the power supply 300 may, for example, take over the role of the power supply 100 or of the power supply 230.

The power supply 300 comprises a closed loop control to regulate the output voltage 312 provided to the load. The power supply 300 comprises an output stage or buffer 320 which may, for example, provide a supply current $I_{sup}$, in order to obtain a supply voltage $V_{sup}$. The buffer 320 may, for example, be an output stage, and may, for example, receive a control signal 322. The buffer or output stage 320 may comprise one or more power semiconductor devices which provide the supply current $I_{sup}$ on the basis of the control signal 322.

The power supply 300 may also comprise a shunt resistor 330, which may, for example, be circuited between an output of the buffer or output stage 320 and a load connection of the power supply, at which the supply voltage $V_{sup}$ is provided to a load. Moreover, the power supply 300 may, for example, comprise a current measurement circuit 340, which may, for example, measure a voltage drop across the shunt resistor 330 and provide a current information describing the supply current $I_{sup}$.

However, it should be noted that the shunt resistor 330 and the current measurement circuit 340 may be considered as being optional.

The power supply 300 also comprises a feedback loop, which may, for example, comprise a digital regulator 350. The digital regulator 350 may, for example, receive a digital control deviation information 352, which may, for example, represent a difference between a desired value (represented by a desired value information 312) and an actual value information 354 describing the actual supply voltage $V_{sup}$. The actual value information may, for example, be provided by an analog-to-digital converter 360, an input of which may be coupled to the load connection via a buffer 370 (wherein the buffer 370 may be considered as being optional). The control deviation information 352 may, for example, be obtained by a subtraction of the actual value information 354 from the desired value information 310.

The digital regulator 350 may provide a digital control information 356 to a digital-to-analog converter 380, which provides the (analog) control signal 322 on the basis of the digital control information 356.

Thus, the digital regulator 350 may be configured to regulate the supply voltage $V_{sup}$ to a desired value described by the desired value information 310.

Moreover, it should be noted that the digital regulator 350 may comprise an integral control component. For example, the digital regulator 350 may perform a proportional-integral regulation or a proportional-integral-differential regulation, or an integral regulation. For this purpose, the digital regulator 350 may, for example, comprise an integrator, which may be a digital integrator.

However, the power supply 300 may, for example, also comprise a voltage variation compensation mechanism, as described herein. The power supply may, for example, be configured to perform an at least partial compensation of a voltage variation (of the supply voltage $V_{sup}$) caused by a load change using a voltage variation compensation mechanism which is triggered in response to an expected load change.

For example, in response to an expected load change, an "injector value" may be injected into the digital regulator 350. The injector value may, for example, change a value of the above-mentioned integrator of the digital regulator 350, for example, in a step-wise manner. For example, the injector value may be added to the integrator value, to thereby amend the integrator value, or the injector value may be subtracted from the integrator value to thereby amend the integrator value. Thus, whenever an expected load change is signaled (for example, by an external signaling, or by a test control, or by a test processor), an injector value may be injected into the digital regulator 350, for example, into the integrator of the digital regulator 350. Consequently, a supply current $I_{sup}$ provided by the buffer or output stage 320 can be changed rapidly (without the normal "inertia" of the digital control loop). The increase of the supply current $I_{sup}$ may even be performed proactively or preemptively, i.e., before a load change actually occurs. Alternatively, the increase of the supply current $I_{sup}$ may occur in very close temporal proximity to the load change, to thereby avoid an excessive supply voltage variation.

It should be noted that the injection of the "injector value" into the digital regulator 350 may be based on a detection of an expected load change, and may, for example, be in synchronism with a generation of a stimulus pattern, or may occur in response to a certain response data signal provided by a device under test. In other words, any of the concepts disclosed herein for the activation or triggering of the voltage variation compensation mechanism may be used to trigger the injection of the injector value into the digital regulator 350.

To briefly summarize, the power supply 300 comprises a voltage regulation loop (which comprises the buffer 370, the analog-to-digital converter 360, a combiner or subtractor 353, the regulator 350, the digital-to-analog converter 380 and the buffer or output stage 320) which is configured to regulate the output voltage $V_{sup}$ of the power supply. The control loop comprises the regulator 350, which is configured to determine a control signal (for example, the digital control information 356), in order to regulate the supply voltage $V_{sup}$ provided by the power supply to a desired value (which may, for example, be represented by the desired value information 310). The regulator 350 comprises an integrator (which may, for example, receive a signal or an information describing the difference between the desired value information 310 of the supply voltage and an actual value information 354 of the supply voltage as an input quantity). The output signal of the regulator 350 may, for example, be used to derive a control signal 322 for the output stage 320 which provides a supply current $I_{sup}$, in order to obtain the desired supply voltage $V_{sup}$.

The voltage variation compensation mechanism is configured to modify (e.g., increase by a predetermined value, or decrease by a predetermined value) a value of the integrator in response to the signaling of an expected load change (e.g., in a step-wise manner), and/or in feed-forward manner (e.g., independent from a feedback signal) and/or in response to a signal from a test control (e.g., a test processor) of an automated test equipment. Accordingly, a fast (and typically step-like) increase of the supply current $I_{sup}$ can be achieved, which is typically caused by a fast (and preferably step-wise) increase of the control signal 322.

It should be noted that the regulator 350 is preferably a digital regulator, wherein the voltage variation compensation mechanism is configured to increase or decrease a value of the (digital) integrator in response to the signaling of the expected load change or in response to a signal from a test control (e.g., a test processor) of an automated test equipment.

However, it should be noted that the concepts described here may also be applied in the presence of an analog control loop, wherein the injector value may, for example, be injected into an analog integrator.

Moreover, it should be noted that the injector value, which is injected in response to a signaling of an expected load change or in response to a signal from a test control, may be injected at a different location of the feedback loop. For example, the injector value could also be added to the digital control information 356 or even to the analog control signal 322. Furthermore, an injector value could also be injected into (e.g., added to) the signal or information 352 or injected into (e.g. added to) the signal or information 354. However, it has been found that an injection of the injector value into the integrator of the digital regulator 350 is particularly easy to implement, since a one-time change of the integrator value is often sufficient in order to obtain a desired response.

To conclude, the power supply 300 is well-suited to keep a supply voltage variation small.

Moreover, it should be noted that the power supply 300 may optionally be supplemented by any of the features, functionalities and details disclosed herein, both individually and taken in combination.

4. Power Supply According to FIG. 4

Figure 4:
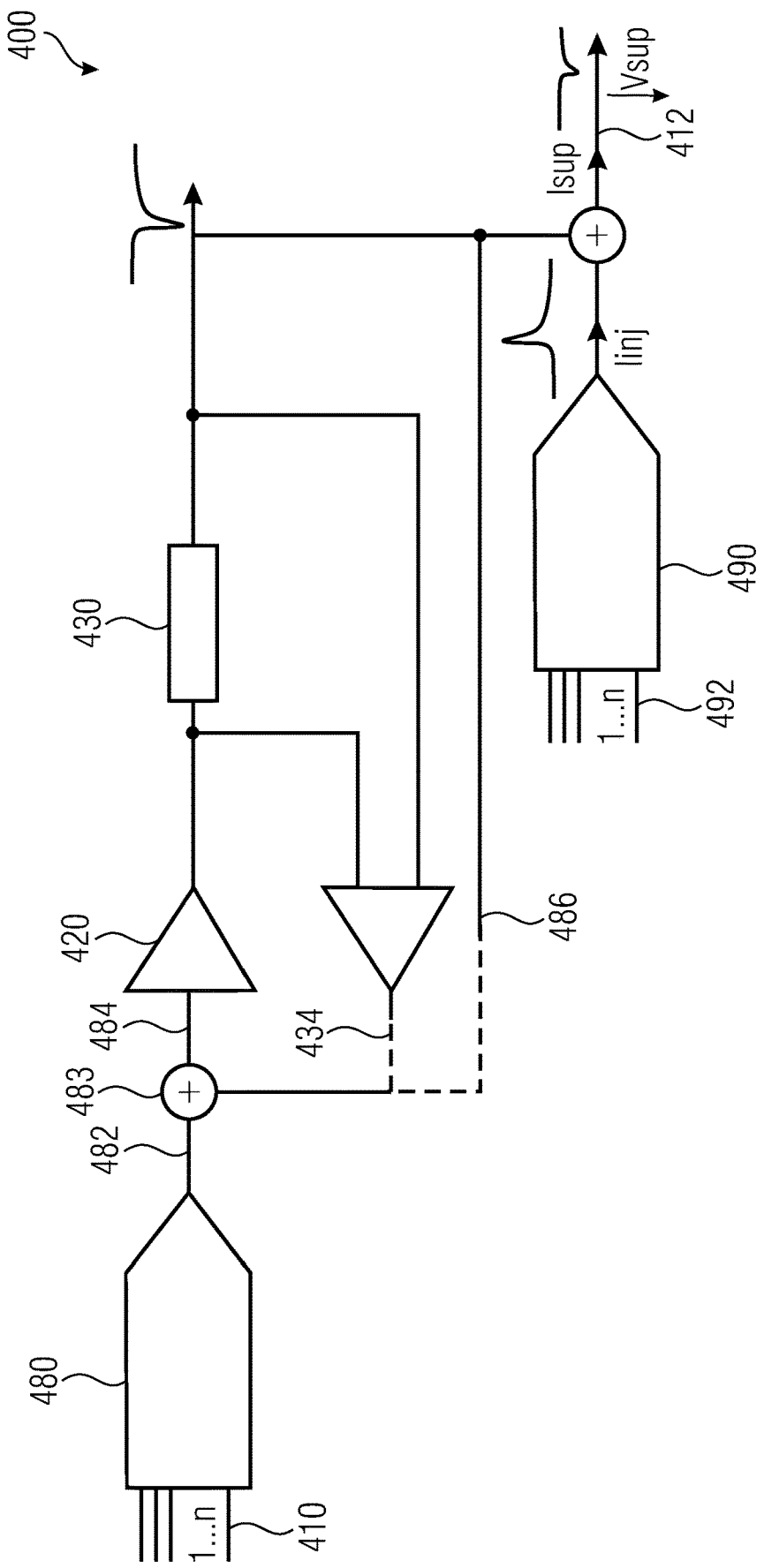
FIG. 4 shows a block schematic diagram of a power supply, according to an embodiment of the present invention.

FIG. 4 shows a block schematic diagram of a power supply, according to another embodiment of the present invention. The power supply 400 is configured to receive a digital desired voltage information 410 and to provide, on the basis thereof, a supply voltage 412 (also designated as $V_{sup}$) to a load. The power supply 400 comprises a closed loop regulation in order to regulate the supply voltage $V_{sup}$. For example, the power supply 400 comprises an output stage 420, which may, for example, correspond to the output stage 320. However, the output stage 420 may, for example, also comprise a functionality of an analog regulator. The power supply 400 comprises a feedback path, which may, for example, feed back the supply voltage $V_{sup}$ (or a signal which represents the supply voltage $V_{sup}$) to the output stage 420.

For example, the power supply 400 may comprise a digital-to-analog converter 480, which may digital-to-analog convert the desired supply voltage information 410, to obtain an analog desired supply voltage signal 482. For example, the analog desired supply voltage signal 482 may be combined with the fed-back supply voltage signal 486 (wherein, for example, the fed-back supply voltage signal 486 may be subtracted from the analog desired supply voltage signal 482) in the adder or combiner 483, to obtain a control signal 484 for the output stage (or buffer) 420 (which may, for example, also comprise a control amplifier).

However, an output of the output stage 420 may, for example, be coupled to a load connection via a shunt resistor 430, which may allow for a current measurement of the supply current contribution provided by the output stage 420.

Moreover, the power supply 400 also comprises a (second) digital-to-analog converter 490, which provides an injection current $I_{inj}$ in response to a digital injection value information 492. For example, an output of the digital-to-analog converter may be coupled to an output of the power supply, such that the injection current $I_{inj}$ is provided directly to a load connection of the power supply. In other words, both a current provided by output stage 420 (also designated as supply current contribution) and an injection current $I_{inj}$ provided by the (second) digital-to-analog converter 490 may sum-up and result in the supply current $I_{sup}$, which is provided to the load at the load connection of the power supply.

Thus, the power supply or device power supply (DPS) 400 comprises a droop compensation and an active droop cancelation.

For example, the injection current $I_{inj}$ may be provided in response to an expected load change, to thereby avoid an excessive supply voltage variation of the supply voltage $V_{sup}$.

Moreover, it should be noted that, in some embodiments, the supply voltage $V_{sup}$ may be fed back to the adder or subtractor 483, which, for example, adds the supply voltage signal to the analog desired supply voltage signal 482, to obtain the control signal 482 for the output stage 420. Alternatively, the supply voltage signal may also be subtracted from the analog desired supply voltage signal 482, to obtain the control signal 482 for the output stage 420.

Alternatively, however, a current signal 434, which represents the output current of the output stage 420, and which may be based on a voltage difference across the shunt resistor 430, may be fed back to the adder 483, and may be added to the analog desired supply voltage signal 482, to obtain the control signal 484 for the output stage 420. Accordingly, the control signal 484 for the output stage 420 may, for example, be increased in response to an increase of the output current of the output stage 420.

However, optionally, both the current signal 434, which represents the output current of the output stage 420, and the voltage signal 486, which represents the supply voltage Vsup, may be fed back to the adder or combiner 483, in order to adjust the control signal 484.

To conclude, the power supply 400 comprises both a droop compensation and an active Droop cancelation. For example, the injection current $I_{inj}$ is provided by the digital-to-analog converter 490 (possibly in combination with a power stage).

To further conclude, the power supply according to FIG. 4 allows for an active droop cancellation. Thus, the circuit according to FIG. 4 constitutes a step for further improving dynamic behavior of power supplies of device power supplies (DPS).

However, the power supply 400 according to FIG. 4 may optionally supplemented by any of the features, functionalities and details disclosed herein, both individually and taken in combination.

5. Test Concept According to FIG. 5

Figure 5:
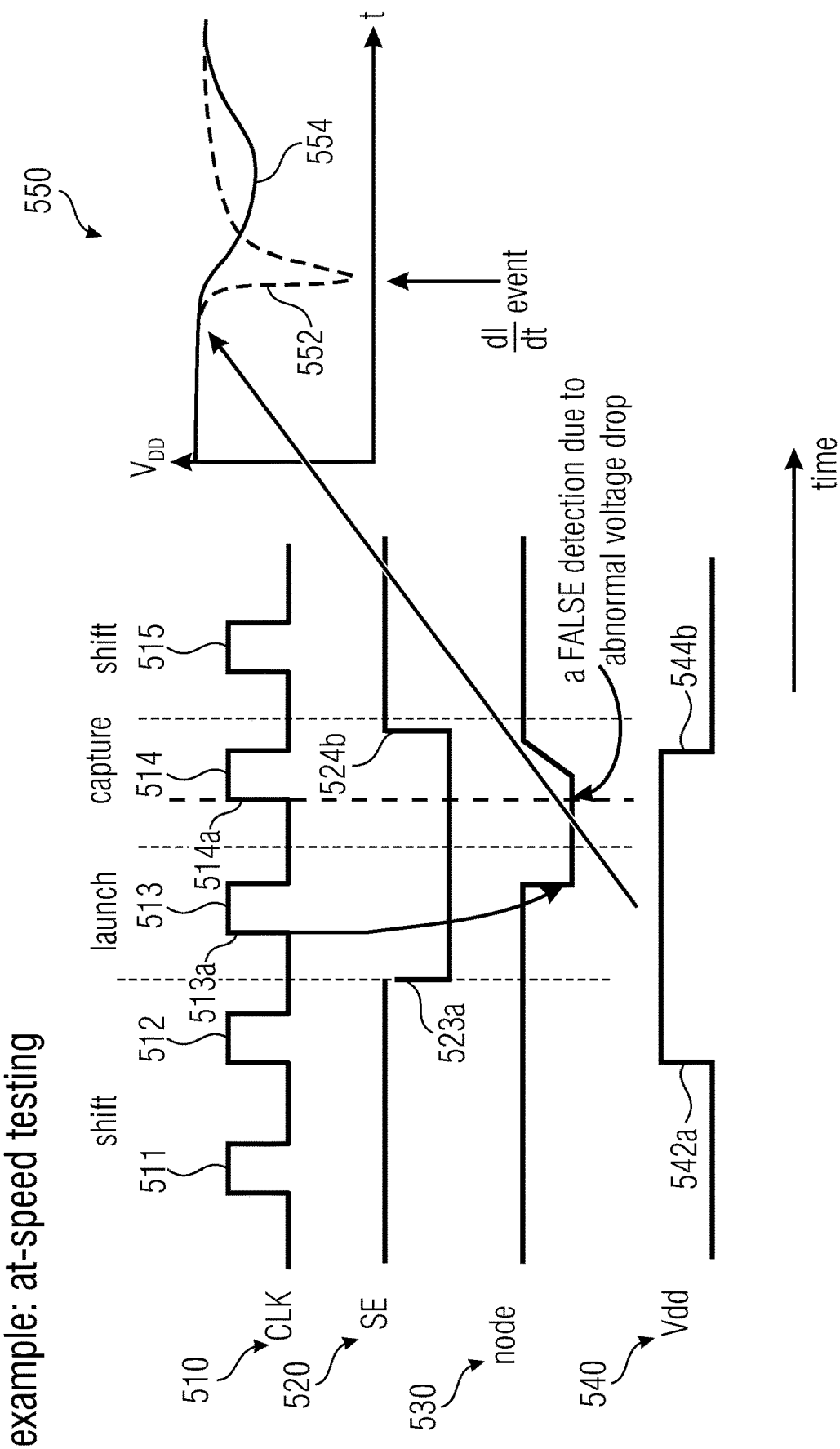
FIG. 5 shows a schematic representation of an operation of an automated test equipment, according to an embodiment of the present invention.

FIG. 5 shows a schematic representation of a test concept, according to an embodiment of the present invention. However, it should be noted that the test concept according to FIG. 5 may, for example, be performed using the power supplies 100, 300 and 400, and may also be performed using the automated test equipment 200 according to FIG. 2.

In the test concept according to FIG. 5, stimulus signals CLK (e.g., a clock signal) and SE (e.g., a scan enable signal) are provided. For example, the signals CLK and SE may be provided by the pattern generator 240 according to FIG. 5. For example, the clock signal CLK may be used to clock data (not shown in FIG. 5) into a device under test (for example, into the device 220), for example, into a scan chain of the device under test. Moreover, an activation of the SE signal may result in an execution of an operation in the device under test which may, for example, be triggered by an edge of the clock signal.

FIG. 5 represents said signals over time. For example, a temporal evolution of the clock signal CLK is shown at reference numeral 510, a temporal evolution of the SE signal is shown at reference number 520, and a temporal evolution at a node of the device under test is shown at reference 530.

For example, a first pulse 511 of the clock signal and a second pulse 512 of the clock signal may clock data into a scan chain of a device under test. Following the second pulse 512 of the clock signal, a scan enable signal may be activated (falling edge 513a of the scan enable signal SE). A next pulse 513 of the clock signal (for example, a rising edge 513a thereof) may launch an execution of an operation, for example, using the data which have been clocked into the scan chain previously (for example, using clock pulses 511, 512). The launch or execution of an operation, which is performed in response to the rising edge 513a may, for example, result in an increase of a current consumption of the device under test, because a processing unit is activated or because a processing operation is performed. Accordingly, as a result of the processing operation, a signal at a node of the device under test is obtained. This signal is shown at reference number 530. At a next pulse 514 of the clock signal, or at a rising edge 514a thereof, the signal at the node of the device under test may be captured, for example, may be loaded into a scan chain for readout to the automated test equipment 200. Following this "capture" operation, additional shift operations will be performed, for example, in response to one or more subsequent pulses 515 of the clock signal 510. In particular, the scan enable signal 520 may be deactivated subsequent to the capture operation (rising edge 524b).

However, it should be noted that in response to the "launch" command, a load change may occur. For example, an increase of a current consumption of the device under test may occur, which may result in a drop of the supply voltage $V_{DD}$ of the device under test. This drop of the supply voltage, which is caused by the load change, is also designated as "dI/dt" event.

However, in conventional approaches, such a drop of the supply voltage of the device under test, which is shown in a graphical representation 550 at reference numeral 552, would typically strongly degrade the operation of the device under test and might even result in a falsification of signals within the device under test. For example, the signal at the DUT node, which is shown at reference numeral 530, could even be changed by such an excessive voltage drop 552.

However, according to a concept of the present invention, the load change, which occurs in response to the rising edge 513a of the clock signal CLK can be predicted, because the behavior of the device under test can be assumed to be deterministic. Accordingly, the supply voltage $V_{dd}$ (herein also designated, for example, with $V_{sup}$ or $V_{DD}$), which is shown at the reference numeral 540, may be increased proactively, for example, before the actual load change (which occurs in response to the rising edge 513a of the CLK signal). This "preemptive" increase of the supply voltage $V_{dd}$ may be caused, for example, by the voltage variation compensation mechanism described herein, which may be triggered in response to the expected load change. For example, the increase of the supply voltage $V_{dd}$, which is shown as an edge 542a, may be triggered by the pattern generator 240, which provides the signals CLK and SE, or may be triggered in synchronism with the provision of the stimulus signals CLK, SE by the pattern generator 240. In other words, the automated test equipment may be aware when the edge 513a of the clock signal, which causes the load change, will occur, and the automated test equipment may be configured to activate or trigger the voltage variation compensation mechanism at a given time before the edge 513a. Consequently, the voltage variation compensation mechanism 232 may take appropriate measures to reduce the voltage drop caused by the load change, for example, by the preemptive increase of the supply voltage $V_{dd}$ (or $V_{sup}$). However, it should be noted that any other appropriate impact onto the power supply, or onto the closed loop control of the power supply, which counteracts a voltage drop, may also be effected by the voltage variation compensation mechanism.

It should be noted that there may be another predictable load change after the execution of the operation, namely a reduction of the DUT current consumption. For example, it can be assumed that the current consumption of the device under test reduces sometime after the "launch" operation, i.e., sometime after the rising edge 513a of the CLK signal. Accordingly, the voltage variation compensation mechanism may, for example, be activated to at least partially compensate such a load reduction, for example, by reducing the supply voltage $V_{dd}$ in temporal coordination with the rising edge 513a of the clock signal. For example, such a reduction of the supply voltage is shown at reference number 544b, wherein the reduction of the supply voltage can also be effected by the automated test equipment in temporal synchronism of the provision of the stimulus signals CLK, SE.

Accordingly, it is apparent that a voltage drop of the supply voltage $V_{DD}$, which is shown at reference numeral 554, may be reduced when compared to the excessive drop of the supply voltage shown at reference numeral 552. Accordingly, a false detection due to an abnormal (excessive) voltage drop, which could occur without the voltage variation compensation mechanism described herein, can be avoided.

It should be noted that the discussion of FIG. 5 should be considered as an example only. Details of this example will not need to be introduced into the embodiments according to the invention. However, FIG. 5 illustrates that load changes may be related to the stimulus signals in a deterministic manner. Accordingly, it is apparent that an activation of the voltage variation compensation mechanism in temporal synchronism with the stimulus signals helps to avoid excessive supply voltage changes.

6. Conclusions

To conclude, embodiments according to the invention allow to reduce a voltage droop. Embodiments according to the invention help to improve a sensitivity of a device power supply (DPS) to load changes. Thus, embodiments according to the invention bring along one or more of the following advantages: low voltage droop at the device under test, improved test quality, better yield.

According to an aspect of the invention, an adder with a digital to analog converter injects a voltage that is opposite to an expected droop voltage. According to another aspect of the invention, a droop is compensated. Thus, the output voltage is more stable and independent of load current changes.

Moreover, taking reference to FIG. 5, an at-speed testing has been discussed. The example according to FIG. 5 shows a pattern synchronous voltage droop compensation, according to an embodiment of the present invention.

To further conclude, embodiments according to the invention allow for a more precise testing of DUTs. By reducing a voltage drop that is caused by a load change, the test results are more meaningful and may, for example, allow for a more reliable sorting of devices under test into different voltage classes.

7. Implementation Alternatives

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, one or more of the most important method steps may be executed by such an apparatus.

Depending on certain implementation requirements, embodiments of the invention can be implemented in hardware or in software. The implementation can be performed using a digital storage medium, for example a floppy disk, a DVD, a Blu-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein. The data carrier, the digital storage medium or the recorded medium are typically tangible and/or non-transitionary.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

A further embodiment according to the invention comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are preferably performed by any hardware apparatus.

The apparatus described herein may be implemented using a hardware apparatus, or using a computer, or using a combination of a hardware apparatus and a computer.

The apparatus described herein, or any components of the apparatus described herein, may be implemented at least partially in hardware and/or in software.

The methods described herein may be performed using a hardware apparatus, or using a computer, or using a combination of a hardware apparatus and a computer.

The methods described herein, or any components of the apparatus described herein, may be performed at least partially by hardware and/or by software.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

The invention claimed is:

1. A power supply comprising:
 a voltage variation compensation circuit configured to perform at least a partial compensation of a voltage variation caused by a load change wherein the voltage variation compensation circuit is configured to be triggered in response to an expected load change; and
 a voltage regulation loop configured to regulate an output voltage of the power supply.

2. The power supply according to claim 1, wherein the voltage variation compensation circuit comprises an active voltage variation compensation mechanism.

3. The power supply according to claim 1, wherein the voltage variation compensation circuit comprises a feedforward voltage variation compensation mechanism.

4. The power supply according to claim 1, wherein the voltage variation compensation circuit is adapted to become active before the load change takes place.

5. The power supply according to claim 1, wherein the voltage variation compensation circuit is further configured to inject a voltage variation compensation quantity into the voltage regulation loop in response to one of: an expected load change; and to a signal from a test control of an automated test equipment.

6. The power supply according to claim 5, wherein the voltage variation compensation quantity is adapted to counteract an expected voltage variation caused by the expected load change.

7. The power supply according to claim 1, wherein the voltage variation compensation circuit is configured to cause a step-change of a control signal of the voltage regulation loop in response to one of: a signal indicating the expected load change; and a signal from a test control of an automated test equipment.

8. The power supply according to claim 1,
 wherein the voltage regulation loop comprises a regulator configured to determine a control signal operable to regulate a supply voltage ($V_{sup}$) provided by the power supply to a desired value,
 wherein the regulator comprises an integrator, and
 wherein further the voltage variation compensation circuit is configured to modify a value of the integrator in response to one of: a signal associated with the expected load change; and a signal from a test control of an automated test equipment.

9. The power supply according to claim 8,
 wherein the regulator is a digital regulator, and
 wherein the voltage variation compensation circuit is configured to increase or decrease a value of the integrator in response to one of: a signal associated with the expected load change; and a signal from a test control of an automated test equipment.

10. The power supply according to claim 1,
 wherein the voltage variation compensation circuit is configured to inject a voltage variation compensation quantity ($I_{inj}$) at an output of the power supply in response to one of: a signal associated with the expected load change; and a signal from a test control of an automated test equipment.

11. The power supply according to claim 10,
wherein the voltage variation compensation circuit is configured to inject a current ($I_{inj}$), which at least partially compensates the expected load change, at the output of the power supply in response to one of: a signal associated with the expected load change; and a signal from a test control of an automated test equipment.

12. The power supply according to claim 1,
wherein the voltage variation compensation circuit is configured to at least partially compensate both a voltage drop and a voltage overshoot.

13. The power supply according to claim 1,
wherein the voltage variation compensation circuit is configured to adapt to an expected magnitude of the expected load change.

14. The power supply according to claim 1,
wherein the voltage variation compensation circuit is configured to obtain a signal associated with the expected load change and simultaneously provide one or more stimulus signals to a load which is supplied by the power supply.

15. An automated test equipment for testing a device under test comprising:
a power supply configured to supply the device under test and comprising a voltage variation compensating circuit;
a pattern generator configured to provide one or more stimulus signals for the device under test; and
wherein the power supply is configured to perform an at least partial compensation of a voltage variation caused by a load change using the voltage variation compensation circuit configured to be activated simultaneously with one of: one or more of the stimulus signals and one or more response data signals from the device under test.

16. The automated test equipment according to claim 15,
wherein the one or more stimulus signals is provided simultaneously with a common clock signal or with a common synchronization signal, and
wherein the power supply is configured to trigger a compensation operation for performing the at least partial compensation of the voltage variation simultaneously with one of: the common clock signal; and the common synchronization signal.

17. The automated test equipment according to claim 15,
wherein the power supply is configured to trigger a compensation operation for performing the at least partial compensation of the voltage variation simultaneously with one of: a stimulus signal which activates a device under test; a stimulus signal which activates a device under test component; a stimulus signal which triggers an operation of the device under test; a stimulus signal which deactivates the device under test; and a stimulus signal which deactivates a device under test component.

18. The automated test equipment according to claim 15, wherein the voltage variation compensation circuit is triggered in response to an expected load change.

19. A method of operating a power supply the method comprising
performing an at least partial compensation of a voltage variation caused by a load change using a voltage variation compensation circuit configured to be triggered in response to an expected load change; and
regulating an output voltage of the power supply using a voltage regulation loop.

20. A non-transitory computer-readable medium having computer-readable program code embodied therein for causing a computer system to perform a method of operating an automated test equipment for testing a device, the method comprising:
supplying power to the device under test,
providing one or more stimulus signals for the device under test; and
performing an at least partial compensation of a voltage variation caused by a load change using a voltage variation compensation circuit operable to be activated simultaneously with one of: one or more of the stimulus signals; and in response to one or more response data signals from the device under test.

* * * * *